(12) United States Patent
Osano

(10) Patent No.: US 11,715,035 B2
(45) Date of Patent: Aug. 1, 2023

(54) INFORMATION PROCESSING APPARATUS, MACHINE LEARNING APPARATUS, AND INFORMATION PROCESSING METHOD

(71) Applicant: SEIKO EPSON CORPORATION, Tokyo (JP)

(72) Inventor: Hiroka Osano, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 487 days.

(21) Appl. No.: 16/838,097

(22) Filed: Apr. 2, 2020

(65) Prior Publication Data

US 2020/0320434 A1 Oct. 8, 2020

(30) Foreign Application Priority Data

Apr. 4, 2019 (JP) .................................. 2019-071808

(51) Int. Cl.
*G06N 20/00* (2019.01)
*G06N 5/04* (2023.01)
*G06Q 10/20* (2023.01)
*G06F 30/27* (2020.01)

(52) U.S. Cl.
CPC ............. *G06N 20/00* (2019.01); *G06F 30/27* (2020.01); *G06N 5/04* (2013.01); *G06Q 10/20* (2013.01)

(58) Field of Classification Search
CPC .......... G06F 30/27; G06N 20/00; G06N 5/04; G06Q 10/20
See application file for complete search history.

(56) References Cited

U.S. PATENT DOCUMENTS

| | | | |
|---|---|---|---|
| 10,574,840 B1 * | 2/2020 | Sabandith | G06K 9/6217 |
| 10,666,814 B2 * | 5/2020 | Baba | G06N 5/045 |
| 2007/0279653 A1 | 12/2007 | Bonikowski | |
| 2017/0011308 A1 * | 1/2017 | Sun | G06F 11/00 |
| 2018/0249298 A1 * | 8/2018 | Jain | G06V 20/36 |
| 2018/0373233 A1 | 12/2018 | Goto | |
| 2019/0340819 A1 * | 11/2019 | Chandrashekarappa | G06F 9/451 |
| 2020/0019935 A1 * | 1/2020 | Jan | G06N 20/20 |
| 2020/0118052 A1 * | 4/2020 | Jensen | H04L 47/11 |
| 2020/0233615 A1 * | 7/2020 | Hirata | G06N 20/10 |

FOREIGN PATENT DOCUMENTS

| | | |
|---|---|---|
| JP | 2007-323643 A | 12/2007 |
| JP | 2019-008675 | 1/2019 |
| JP | 2019-018979 | 2/2019 |
| JP | 2019-028671 | 2/2019 |

* cited by examiner

*Primary Examiner* — Azizul Choudhury
(74) *Attorney, Agent, or Firm* — Workman Nydegger

(57) ABSTRACT

Provided is an information processing apparatus including a storage that stores a machine-learned model created through machine learning using teacher data in which at least one of status information indicating a status of a device to be maintained and installation environment information indicating an environment where the device to be maintained is installed is associated with maintenance to be performed on the device to be maintained, and a processor that acquires maintenance to be performed on the device to be maintained using at least one of the status information of the device to be maintained and the installation environment information, and the machine-learned model, and displays a maintenance priority order.

5 Claims, 5 Drawing Sheets

INFORMATION PROCESSING APPARATUS, MACHINE LEARNING APPARATUS, AND INFORMATION PROCESSING METHOD

The present application is based on, and claims priority from JP Application Ser. No. 2019-071808, filed Apr. 4, 2019, the disclosure of which is hereby incorporated by reference herein in its entirety.

BACKGROUND

1. Technical Field

The present disclosure relates to an information processing apparatus, a machine learning apparatus, and an information processing method.

2. Related Art

In the related art, a technique for selecting information to be provided when providing various types of information to a user is known. For example, JP A-2007-323643 discloses a technique for creating a customized maintenance manual in response to a user's input.

When performing maintenance on the device to be maintained, the maintenance to be performed may differ depending on the state of the device to be maintained.

SUMMARY

An object of the present disclosure is to increase the possibility of efficiently maintaining a device to be maintained.

According to an aspect of the present disclosure, an information processing apparatus includes a storage that stores a machine-learned model created through machine learning using teacher data in which at least one of status information indicating a status of a device to be maintained and installation environment information indicating an environment where the device to be maintained is installed is associated with maintenance to be performed on the device to be maintained, and a processor that acquires maintenance to be performed on the device to be maintained using at least one of the status information of the device to be maintained and the installation environment information, and the machine-learned model, and displays a maintenance priority order. According to this configuration, the repair service provider can easily identify the maintenance to be performed from among a plurality of types of maintenance. As a result, there is a high possibility that the device to be maintained can be efficiently maintained.

According to an aspect of the present disclosure, maintenance that is indicated by the teacher data, and which is to be performed on the device to be maintained may be maintenance performed when an error of the device to be maintained is fixed without a repair service provider performing a revisit. That is, when the repair service provider needs to perform a revisit, the error is not fixed before the revisit. Considering the work efficiency of the repair service provider, it is desirable that no revisit occur. Therefore, when learning is performed based on the maintenance in a case where the error of the device to be maintained is fixed without performing a revisit, the learning can be performed so as to output the maintenance through which it is possible to fix an error of the device to be maintained without performing a revisit.

According to the aspect of the present disclosure, maintenance that is indicated by the teacher data, and which is to be performed on the device to be maintained may be maintenance to which a fix of an error of the device to be maintained is attributed. According to this configuration, it is possible to perform learning with maintenance, as teacher data, which is important in order to fix an error.

According to an aspect of the present disclosure, a machine learning apparatus may include a teacher data acquisition unit that acquires teacher data in which at least one of status information indicating a status of a device to be maintained and installation environment information indicating an environment in which the device to be maintained is installed is associated with maintenance to be performed on the device to be maintained, and a learning unit that machine learns, based on the teacher data, a machine-learned model in which at least one of the status information of the device to be maintained and the installation environment information is input, and that outputs maintenance to be performed on the device to be maintained. According to this configuration, the repair service provider can generate a machine-learned model that can identify the maintenance to be performed from among a plurality of types of maintenance. As a result, there is a high possibility that the service provider can efficiently maintain the device to be maintained by using the machine learning result.

DESCRIPTION OF EXEMPLARY EMBODIMENTS

Here, embodiments of the present disclosure will be described in the following order.
1. Configuration of information processing apparatus and machine learning apparatus
2. Machine learning process
3. Maintenance process
4. Other embodiments

Figure 1:
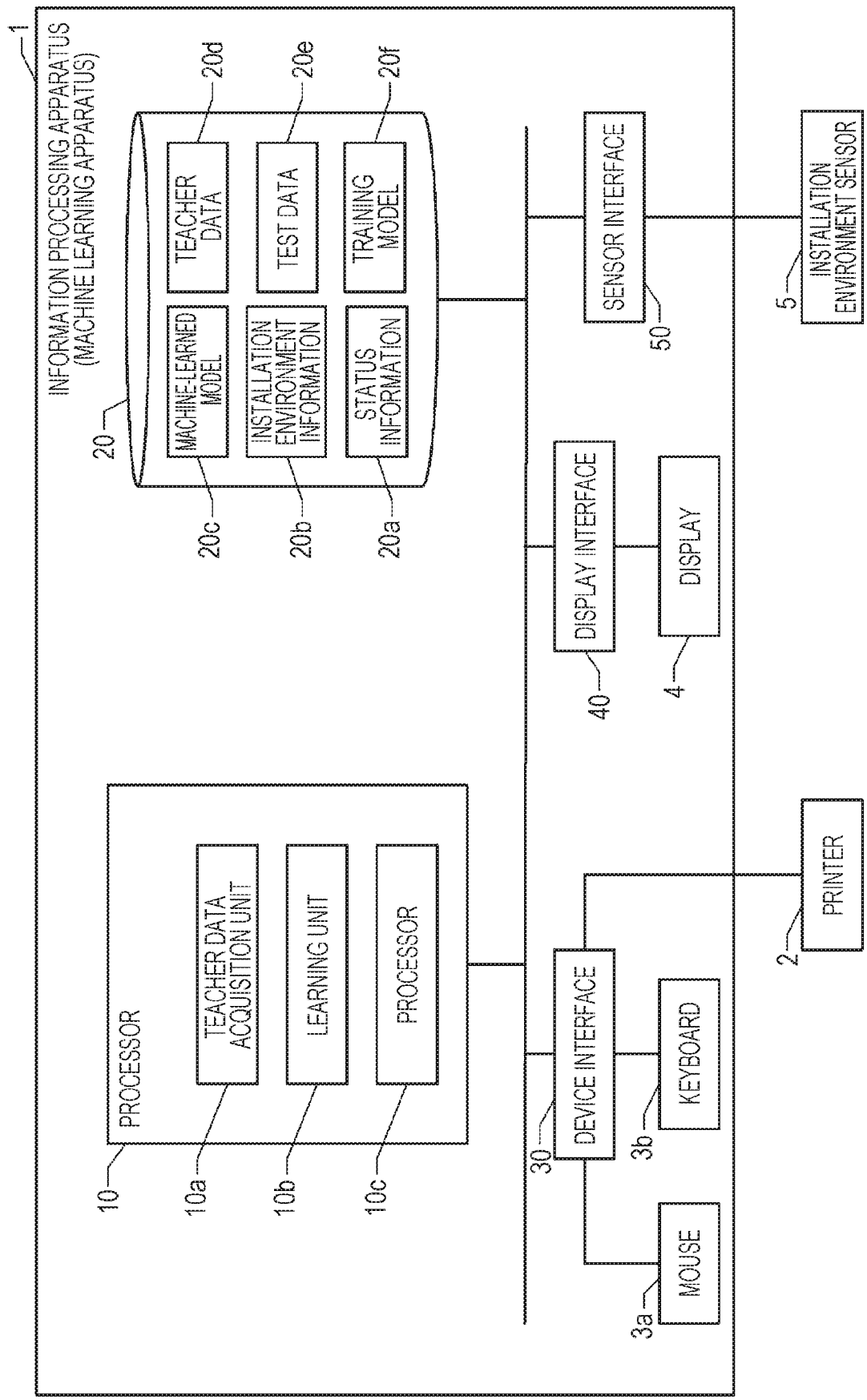
FIG. 1 is a block diagram of an information processing apparatus and a machine learning apparatus.

1. Configuration of Information Processing Apparatus and Machine Learning Apparatus FIG. 1 is a block diagram showing an information processing apparatus 1 according to an embodiment of the present disclosure. In the present embodiment, the device to be maintained is a printer 2. In this embodiment, the user of the printer 2 requests the repair service provider to perform maintenance of the printer 2 when an error occurs in the printer 2. The repair service provider performs maintenance of the requested printer 2 and performs the operation to fix the error.

When performing the maintenance, the repair service provider couples the information processing apparatus 1 to the printer 2. The information processing apparatus 1 is a computer that executes a program for performing the maintenance of the printer 2. That is, when the repair service provider visits the installation place of the printer 2, the repair service provider couples the information processing apparatus 1 to the printer 2, and runs the maintenance program. When the maintenance program is executed, the information processing apparatus 1 provides maintenance options to the repair service provider. When the maintenance option is selected, the information processing apparatus 1 guides the maintenance operation procedure.

In this process, the information processing apparatus 1 acquires various types of information from the printer 2 and performs a diagnosis process for the printer 2. Note that the information processing apparatus 1 in the present embodiment also functions as a machine learning apparatus. In order to performs maintenance support and machine learning the information processing apparatus 1 includes a processor 10, a storage 20 such as a hard disk drive (HDD), a device interface 30, a mouse 3a, a keyboard 3b, a display interface 40 and a display 4.

The device interface 30 is an interface that can couple a device that performs communication according to a predetermined communication protocol (for example, a Universal Serial Bus (USB) standard). In the present embodiment, the printer 2, the mouse 3a, and the keyboard 3b are coupled to the device interface 30.

The printer 2 according to this embodiment is an ink jet printer. That is, the printer 2 includes a carriage (not shown) on which a print head is mounted, and can reciprocate the carriage in a specific direction by a driving force of a motor (not shown). The printer 2 includes a print medium transport mechanism including m and the like (not shown), and can transport the print medium in a direction perpendicular to the movement direction of the carriage by controlling the transport mechanism by the driving force of a motor (not shown). The printer 2 ejects ink from the print head on the print medium while repeating the movement of the carriage and the transport of the print medium, and can print an image two-dimensionally on the print medium.

Furthermore, the printer 2 includes a substrate (not shown) on which a circuit is formed. The printer 2 according to the present embodiment includes a main substrate and a panel substrate. The main substrate is a substrate on which a circuit such as a processor for controlling the respective units such as a carriage, a transport mechanism, and a motor are mounted. Accordingly, in the printer 2, the respective units such as a carriage operate in accordance with a control signal from a processor or the like mounted on the main substrate.

The panel substrate is a substrate on which a circuit such as a processor that performs input/output control and the like related to an operation panel provided in the printer 2 is mounted. Therefore, the user can view various images displayed on the operation panel, and can further give an instruction to the printer 2 by operating the operation panel.

Various methods can be used as a paper feeding method for the printer 2. In the present embodiment, the printer 2 can use a standard size print medium accumulated in a tray and a print medium drawn from roll paper accumulated in a state of being wound around a shaft. That is, the transport mechanism can take out the print medium from the tray and transport it to the printing area. Further, the transport mechanism can draw out the print medium from the roll paper and transport it to the printing area. The printer 2 includes a paper guide for controlling the transport direction of roll paper or a standard print medium. Further, in order to enable printing with roll paper, the printer 2 includes a paper cutter for cutting the roll paper.

In the present embodiment, the processor mounted on the main substrate can collect status information of the printer 2 and output it to the information processing apparatus 1. In this embodiment, the status information includes the current print setting in the printer 2, the print history in the printer 2, an error code indicating the type of error currently occurring, and the state of the nozzles provided in the print head.

The print setting is a parameter that can be set when printing is performed by the printer 2, and examples of the print setting include set values such as the size of the print medium (one of the standard sizes, the medium drawn from the roll paper, and the like), the print surface (one side or both sides), the resolution, the layout, the number of colors used. The print history is information for evaluating the degree to which the printer 2 is used, and examples of the print history include the number of printed sheets up to now, the usage time of m, and the average of ink density (average of the amount of ink used for printing up to now). The history is recorded in a memory (not shown) provided in the main substrate.

The error code is a numerical value indicating the type of error defined in advance. In the present embodiment, malfunctions such as a failure and a paper jam are classified in advance into a plurality of events. The processor mounted on the main substrate uses a sensor (not shown) to identify to which category of the event an error that has occurred corresponds, and thereby can identify the error code.

The state of the nozzle is a state for each of the plurality of ink ejection nozzles provided in the print head. In this embodiment, by applying a voltage to an actuator such as a piezo element included in each of the ejection nozzles of the print head, ink is ejected from each of the ejection nozzles. In the present embodiment, a range of voltage patterns when the voltage is normal is defined. The processor mounted on the main substrate acquires information indicating whether the voltage applied to each ejection nozzle is normal, and determines that the nozzle is clogged when the voltage is not normal.

The mouse 3a includes an operation unit that are held and moved by the user and a button, and outputs information indicating the amount of movement of the operation unit and information indicating the operation result for the button. The information processing apparatus 1 can acquire information output by the mouse 3a via the device interface 30, and can accept a user's operation based on the information. The keyboard 3b includes a plurality of keys, and outputs information indicating operations on the keys. In the present embodiment, the mouse 3a and the keyboard 3b are configured integrally with the information processing apparatus 1. The information processing apparatus 1 can acquire information output from the keyboard 3b via the device interface 30, and can accept a user's operation based on the information. Of course, the mouse 3a and the keyboard 3b may be separated from the information processing apparatus 1, and the input/output device may be another device (for example, a touch panel display).

The display interface 40 is an interface to which the display 4 is coupled. The information processing apparatus 1 can output a control signal to the display 4 via the display interface 40, and can display various images on the display 4. In the present embodiment, since the information processing apparatus 1 is a portable computer, the display 4 and the information processing apparatus 1 are integrated. Of course, the display 4 may be separated from the information processing apparatus 1, and the operation panel provided in the printer 2 may be used instead of the display 4.

A sensor interface 50 is an interface to which an installation environment sensor 5 is coupled. The installation environment sensor 5 is a sensor that detects a temperature, a humidity, and an atmospheric pressure, and outputs these values. The information processing apparatus 1 can output a control signal to the installation environment sensor 5 via the sensor interface 50, and can acquire the installation environment information of the printer 2, that is, the values of the temperature, the humidity, and the atmospheric pressure. The installation environment sensor 5 only needs to be able to measure the temperature, the humidity, and the atmospheric pressure of the place where the printer 2 is installed, and may be integrated with the printer 2 and the information processing apparatus 1.

The processor 10 includes a central processing unit (CPU), a random access memory (RAM), and the like, and can execute various programs recorded in the storage 20. Since the information processing apparatus 1 also functions as a machine learning apparatus, it may include a processor used when machine learning is performed (for example, a graphics processing unit (GPU) or a dedicated processor designed for machine learning).

In this embodiment, the processor 10 can execute a machine learning program that generates a machine-learned model, and a maintenance program that identifies the maintenance to be performed based on the machine-learned model. When one or both of these programs are executed, the processor 10 functions as a teacher data acquisition unit 10a, a learning unit 10b, and a processor 10c.

The processor 10 performs machine learning based on teacher data 20d by the functions of the teacher data acquisition unit 10a and the learning unit 10b, so that it can generate a machine-learned model 20c. In addition, the processor 10 can identify, based on the machine-learned model 20c, the priority order of maintenance to be performed on the printer 2, which is a device to be maintained, by the function of the processor 10c. In the present embodiment, the machine-learned model 20c is created and used for each type of the printers 2.

2. Machine Learning Process

Figure 2:
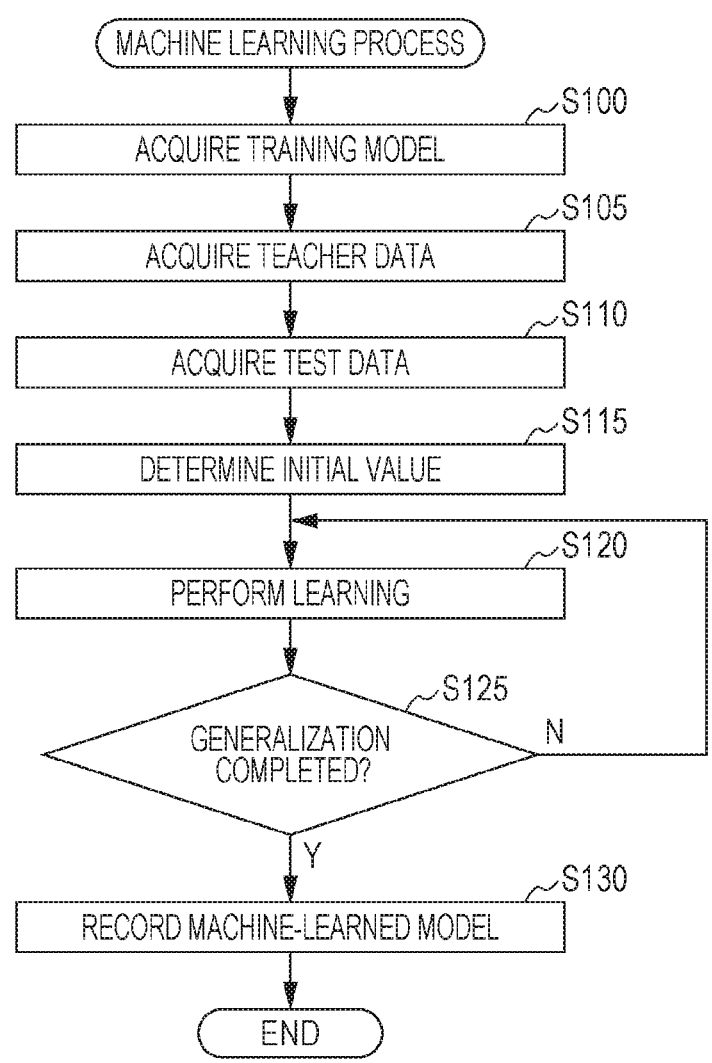
FIG. 2 is a flowchart of a machine learning process.

Next, the machine learning process executed by the processor 10 will be described. FIG. 2 is a flowchart showing the machine learning process. The machine learning process is performed at least once in advance before identifying the priority order of maintenance to be performed on the printer 2. In the present embodiment, the machine-learned model 20c is updated by re-learning. The re-learning may be performed at a predetermined timing. The re-learning may be performed for example, when the teacher data 20d is increased, when a certain period of time has passed since the last learning, when the user perform an instruction and the like.

When the machine learning process is started, the processor 10 acquires a training model by the function of the learning unit 10b (step S100). Here, the model is information indicating an expression for deriving the correspondence between the inference target data and the inference result data. A model that associates status information and installation environment information with maintenance to be performed will be described as an example.

Figure 3:
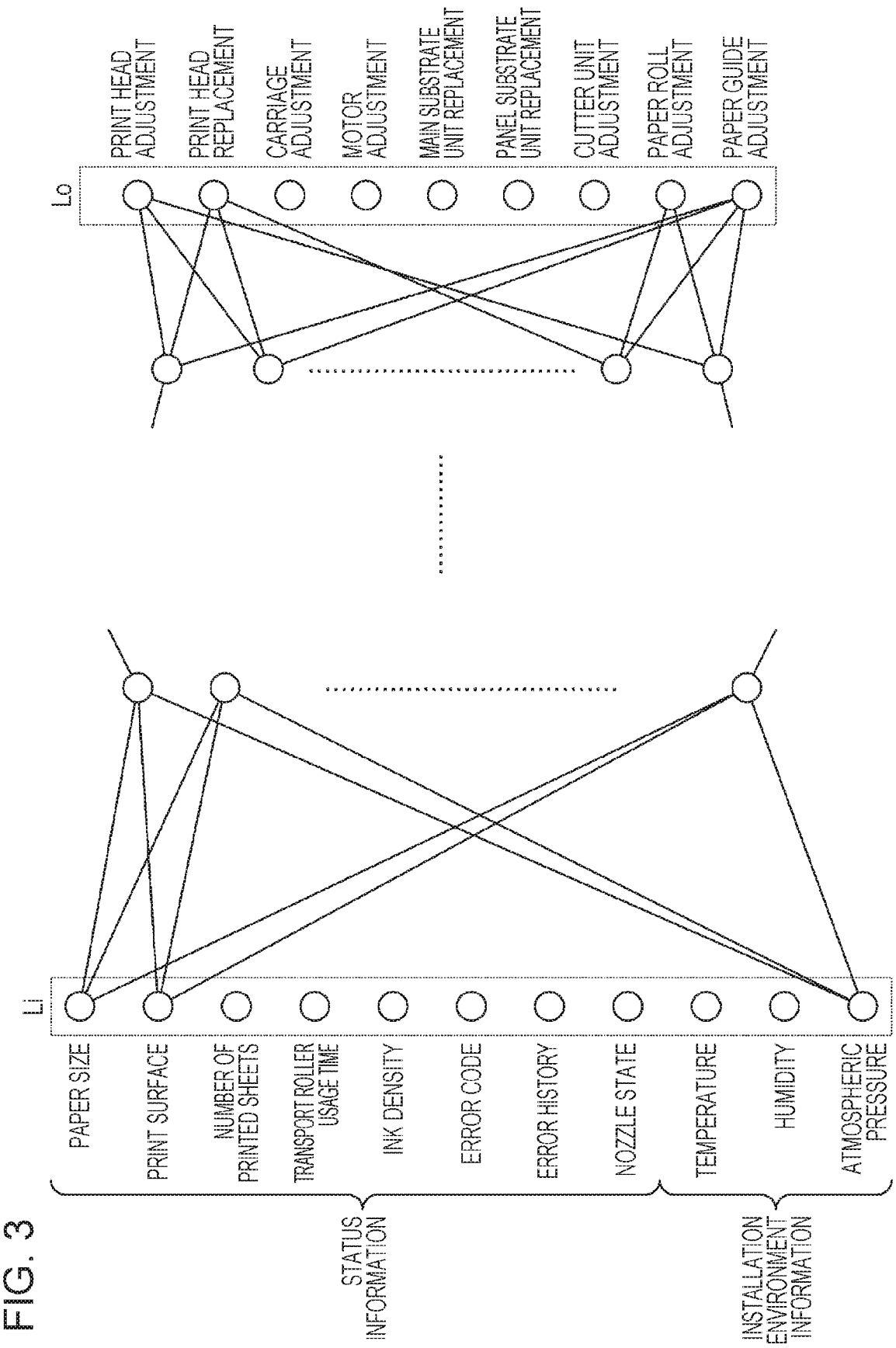
FIG. 3 is a diagram illustrating a model for performing machine learning.

As long as input data is converted into output data, the model can be defined in various ways. In this embodiment, a neural network is used. FIG. 3 is a diagram schematically showing the structure of a neural network according to the present embodiment. In FIG. 3, nodes that mimic neurons are shown as circles, and couplings between nodes are indicated by solid straight lines (however, only part of the nodes and couplings are shown for the sake of simplicity). Also, in FIG. 3, the nodes belonging to the same layer are shown vertically, where the leftmost layer is the input layer Li and the rightmost layer is the output layer Lo.

Here, in the relationship between the two layers, a layer close to the input layer Li is referred to as a higher layer, and a layer close to the output layer Lo is referred to as a lower layer. That is, a structure in which outputs of a layer which is higher than a certain layer by one layer are inputs for the certain layer, and values obtained by respectively multiplying the inputs by weights and respectively adding biases to the multiplied resultant values are output through an activation function is illustrated. The model is configured by providing a plurality of layers in which the calculation using such weights and biases is performed. Therefore, in the present embodiment, the model is configured by data indicating the weights, the biases, and the activation function in at least each layer. Various functions, for example, a sigmoid function, a hyperbolic function (tan h), a rectified linear unit (ReLU), and other functions can be used as the activation function. A nonlinear function may be preferably used. Of course, other conditions necessary for machine learning, for example, parameters such as the type of optimization algorithm and the learning rate may be included. In addition, there may be various aspects as the number of layers, the number of nodes, and the coupling relationship of correlation.

In this embodiment, the status information indicating the status of the printer 2, and the installation environment information of the environment where the printer 2 is installed are used as input data to the input layer Li of the neural network, and the maintenance to be performed is output from the output layer Lo. In the present embodiment, the status information input to the model is the status information of the printer 2 acquired by the processor mounted on the main substrate. The installation environment information input to the model is installation environment information detected by the installation environment sensor 5.

The status information and installation environment information input to the neural network may be expressed by various information. For example, with respect to a paper size, a value indicating one of the paper sizes prepared in advance may be used. Of course, a node for each paper size may be prepared, and a flag 1 may be input to a node of a paper size to be used, and a flag 0 may be input to another node. The error code and error history can be expressed in the same way as the paper size.

The print surface is a flag indicating one side or both sides, and the nozzle state is a flag indicating whether nozzle clogging has occurred. The number of printed sheets is a numerical value indicating the number of printed sheets. When the number of printed sheets exceeds the predetermined number, adjustment such as setting the input value to the maximum value may be performed. The same expression can be used for the density of the transport roller and ink.

In any case, when status information and installation environment information in which various expressions are performed are input to each node of the input layer Li, the input to each node is subjected to weight multiplication and bias summation, and converted to the input of the next layer through an activation function. A value indicating the maintenance to be performed in the output layer Lo is output by repeating the calculation for each layer.

The output in the output layer Lo only needs to indicate the maintenance to be performed, and various forms can be used. In the present embodiment, one or more types of maintenance (operation procedures for the error fix) for each unit are defined in advance in each unit provided in the printer 2. For example, two types of maintenance, which are adjustment and replacement, are defined in advance for the print head. One type of maintenance, which is adjustment, is defined in advance for the carriage. In FIG. 3, the nodes of the output layer Lo correspond to the respective maintenance operations defined in advance. The output value of each node in the output layer Lo is a value from 0 to 1, and the higher the value, the higher the priority order of maintenance. Note that, the present embodiment is standardized so that the sum of the output values of the nodes of the output layer Lo is 1.

Of course, part of the model shown in FIG. 3 may be expressed as a known function, the remaining part thereof may be expressed as an unknown function, and the unknown function may be as a learning target. No matter what form the model is, it is only necessary to construct a model that outputs maintenance to be finally performed when status information and installation environment information are input.

In step S100 in the flowchart shown in FIG. 2, a training model is acquired. Here, the training indicates that it is a learning target. That is, in the training model, (priority order of) the maintenance to be performed is output from the status information and the installation environment information, but the correspondence between input and output is not accurate at the beginning. That is, in the training model, although the number of layers constituted by nodes and the number of nodes are determined, but parameters (such as the weights and the biases described above) that define the relationship between input and output are not optimized. These parameters are optimized (that is, trained) during the machine learning process.

The training model may be determined in advance or may be acquired by the user operating the mouse 3a or the keyboard 3b and inputting the training model. In any case, in the example shown in FIG. 3, the processor 10 acquires, as a training model, a parameter of the neural network that outputs the maintenance to be performed from the status information and the installation environment information. The training model is recorded in the storage 20 as a training model 20f. Of course, when re-learning is performed, the training model may be an existing model.

Next, the processor 10 acquires teacher data by the function of the teacher data acquisition unit 10a (step S105). In the present embodiment, the teacher data 20d is data in which the status information and the installation environment information are associated with the maintenance to be performed. In this embodiment, the same type of device as the printer 2 is a sample, the status information when an error has occurred is acquired by the processor mounted on the main substrate, and the installation environment information of the environment where the sample is installed is acquired.

In addition, the maintenance is performed in the printer 2 in order to fix the error, and the maintenance to which a fix of the error is attributed at this time is identified. That is, when in the state where the error that occurred in the printer 2 is not fixed, a type of maintenance is performed and the error is fixed after the maintenance, the type of maintenance is acquired as the maintenance to which a fix of the error is attributed. According to this configuration, it is possible to obtain the most effective maintenance in order to fix an error that has occurred in a certain status or installation environment.

Once the status information and the installation environment information are acquired as described above, and the maintenance to which a fix of the error is attributed is acquired, these are associated with each other and defined as the teacher data 20d. The teacher data 20d created in advance is recorded in the storage 20, and the processor 10 acquires the teacher data 20d in step S105. In this embodiment, when the maintenance of the printer 2 is performed in the information processing apparatus 1, the teacher data 20d reflecting the result can be added to the information processing apparatus 1 (details will be described later).

Next, the processor 10 acquires test data by the function of the learning unit 10b (step S110). The test data is data for determining whether the learning result is generalized, and is not used for learning. The test data may be prepared separately from the teacher data 20d, but in the present embodiment, part of the teacher data 20d acquired in step S105 is secured as test data.

Next, the processor 10 determines an initial value by the function of the learning unit 10b (step S115). That is, the processor 10 gives an initial value to a variable parameter in the training model acquired in step S100. The initial value may be determined by various methods. For example, a random value, 0, or the like can be used as the initial value, and the initial value may be determined based on an idea different between the weight and the bias. Of course, the initial value may be adjusted so that the parameters are optimized during the learning process. When re-learning is performed, the initial value may be a value of the existing machine-learned model 20c.

Next, the processor 10 performs learning by the function of the learning unit 10b (step S120). That is, the processor 10 inputs the teacher data 20d acquired in step S105 in the training model acquired in step S100, and calculates output indicating the maintenance. Further, the processor 10 identifies an error by a loss function indicating the error between the output maintenance and the maintenance indicated by the teacher data 20d. Then, the processor 10 repeats the process of updating the parameter a predetermined number of times based on the differentiation by the parameter of the loss function. Of course, various functions can be used as the loss function, and for example, a cross-entropy error can be used.

The process of calculating the loss function is performed on all or part of the teacher data 20d, and the loss function in one learning is expressed by the average or the sum. Once the loss function is obtained, the processor 10 updates the parameters by a predetermined optimization algorithm, such as a stochastic gradient descent method.

As described above, when the parameter is updated a predetermined number of times, the processor 10 determines whether the generalization of the training model is completed (step S125). That is, the processor 10 inputs test data 20e acquired in step S110 in the training model to acquire the output indicating the maintenance. The processor 10 acquires the number at which the output maintenance (maintenance corresponding to the maximum value) and the maintenance associated with the test data are matched, and acquires the inference accuracy by dividing the number by the number of samples indicated by the test data 20e. In the present embodiment, the processor 10 determines that the generalization is completed when the inference accuracy is equal to or higher than a threshold value.

In addition to the evaluation of generalization performance, the validity of the hyperparameter may be verified. That is, in a configuration in which a hyperparameter that is an variable amount other than the weight and the bias, for example, the number of nodes or the like is tuned, the processor 10 may verify the validity of the hyperparameter based on the verification data. The verification data may be prepared in advance as in step S110, or may be extracted from part of the teacher data 20d. Of course, verification data is also not used for training.

When it is not determined in step S125 that the generalization of the training model is completed, the processor 10 repeats step S120. That is, the weight and bias are further updated. On the other hand, when it is determined in step S125 that the generalization of the training model is completed, the processor 10 records the machine-learned model (step S130). That is, the processor 10 records the training model in the storage 20 as the machine-learned model 20c.

According to the above configuration, based on the status and the installation environment of the printer 2, it is possible to generate a machine-learned model 20c that outputs the maintenance to be performed in order to fix the error that has occurred in the status or the installation environment. Therefore, the repair service provider does not need to identify the maintenance to be performed at his or her own judgement, and even when the repair service provider has little experience or knowledge, it is likely that appropriate maintenance can be identified. For this reason, the possibility that the printer 2 can be efficiently maintained increases.

3. Maintenance Process

Next, a maintenance process executed by the processor 10 will be described. The repair service provider receives a request for maintenance from the user of the printer 2 and visits the installation place of the printer 2. The repair service provider carries the information processing apparatus 1 and the installation environment sensor 5 and visits the installation place of the printer 2. The repair service provider couples the printer 2 and the installation environment sensor 5 to the information processing apparatus 1, and starts the maintenance process by starting the maintenance program. When the maintenance process is started, the printer 2 starts a response process according to an instruction from the information processing apparatus 1.

Figure 4:
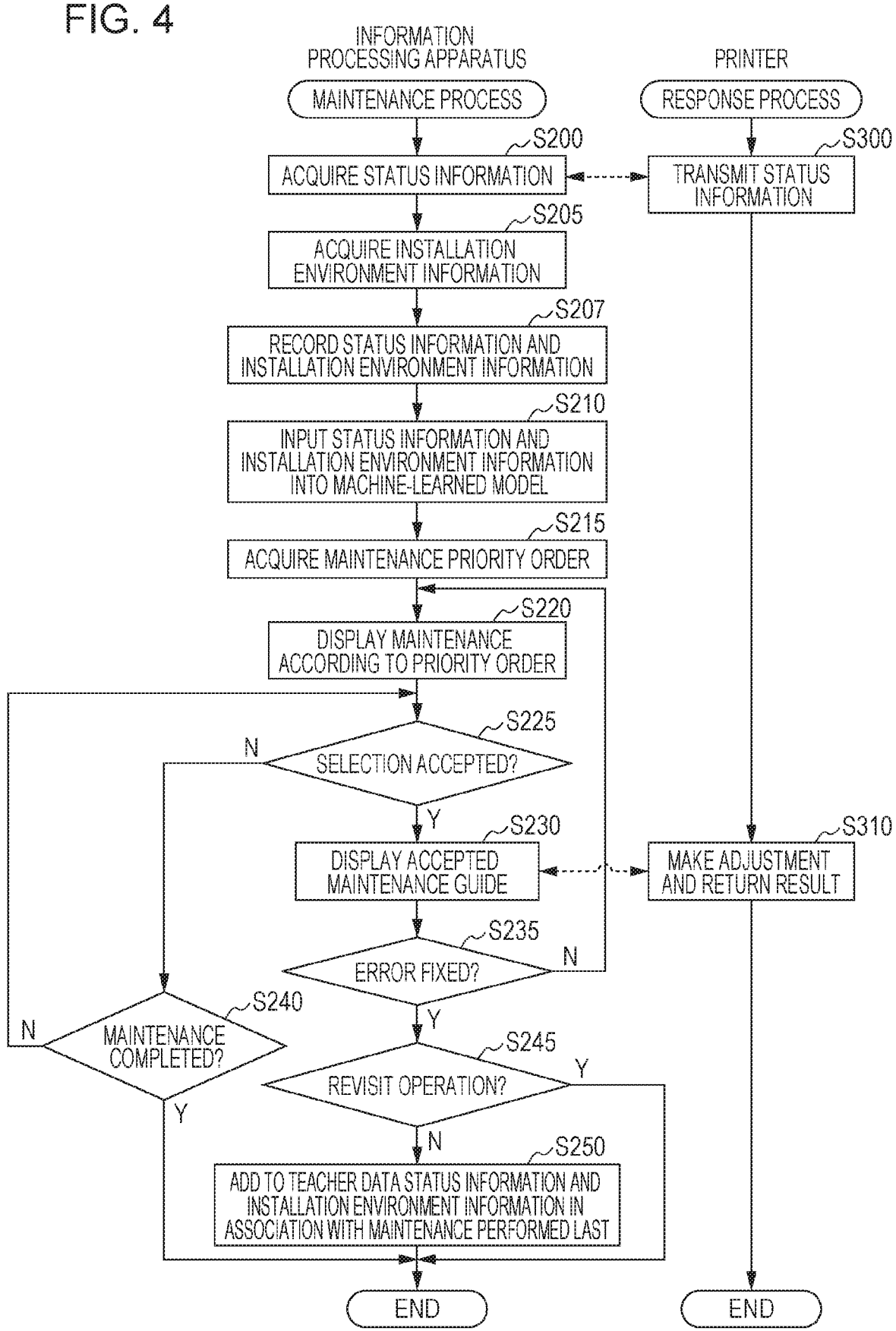
FIG. 4 is a flowchart of a maintenance process.

FIG. 4 is a flowchart showing the maintenance process and the response process. When the maintenance process is started, the processor 10c acquires status information (step S200). That is, the processor 10c instructs the printer 2 to output the status information via the device interface 30.

When the output instruction is performed, the printer 2 transmits the status information (step S300). That is, the processor mounted on the main substrate of the printer 2 acquires an output instruction for the status information. The processor communicates with the respective units of the printer 2 according to the output instruction, and acquires the status information by referring to a memory (not shown). Then, the printer 2 returns status information to the information processing apparatus 1.

The processor 10c acquires the status information. As a result, the processor 10c acquires a current print setting in the printer 2, a print history in the printer 2, an error code indicating the type of error currently occurring, and a value indicating the state of the nozzles provided in the print head. At this time, the processor 10c acquires information indicating the model of the printer 2.

Next, the processor 10c acquires the installation environment information (step S205). That is, the processor 10c instructs the installation environment sensor 5 to output the installation environment information via the sensor interface 50. When the output instruction is performed, the installation environment sensor 5 detects a temperature, a humidity, and an atmospheric pressure, and outputs values of the temperature, the humidity, and the atmospheric pressure. The processor 10c acquires these values as the installation environment information.

Next, the processor 10c records, in the RAM, the status information acquired in step S200 and the installation environment information acquired in step S205 (step S207). Next, the processor 10c inputs the status information and the installation environment information to the machine-learned model (step S210). That is, the processor 10c acquires, from the storage 20, the machine-learned model 20c corresponding to the model of the printer 2 acquired in step S200. The processor 10c uses the status information and the installation environment information as input data for the machine-learned model 20c, and acquires the output result by the machine-learned model 20c. As a result, an output value at a node corresponding to each of a plurality of maintenance operations is obtained.

Next, the processor 10c acquires the priority order of the maintenance (step S215). That is, the magnitude of the output value output from each node in the output layer of the machine-learned model 20c indicates the degree of possibility that the maintenance corresponding to each node is the maintenance to be performed. Therefore, the processor 10c determines that the higher the output value is, the higher the priority order is.

In the present embodiment, the processor 10c sorts the output values in descending order, and determines that the highest output value has the highest priority order. When there is an output value whose difference from the output value is less than or equal to a threshold value, the processor 10c determines that both value has the same priority order. When there is no output value whose difference from the largest output value is less than or equal to the threshold value other than the output value for which the priority order is determined, the processor 10c determines the priority order for all output values by repeating the same process for the remaining output values. Note that the threshold value may be determined in advance, and the magnitude of the threshold value may change (for example, gradually decrease) in the process of repetition.

When the output value is too small, the magnitude of the value may not be considered to indicate the degree of the possibility of maintenance to be performed. Therefore, in this embodiment, when the output value is equal to or less than the predetermined value, the priority order is not given to the maintenance corresponding to the node.

Next, the processor 10c displays maintenance according to the priority order (step S220). That is, the processor 10c controls the display 4 via the display interface 40 to display a screen for accepting maintenance selection. The maintenance as an option is selectively displayed on this screen, and each maintenance is displayed side by side in accordance with the priority order.

Figure 5:
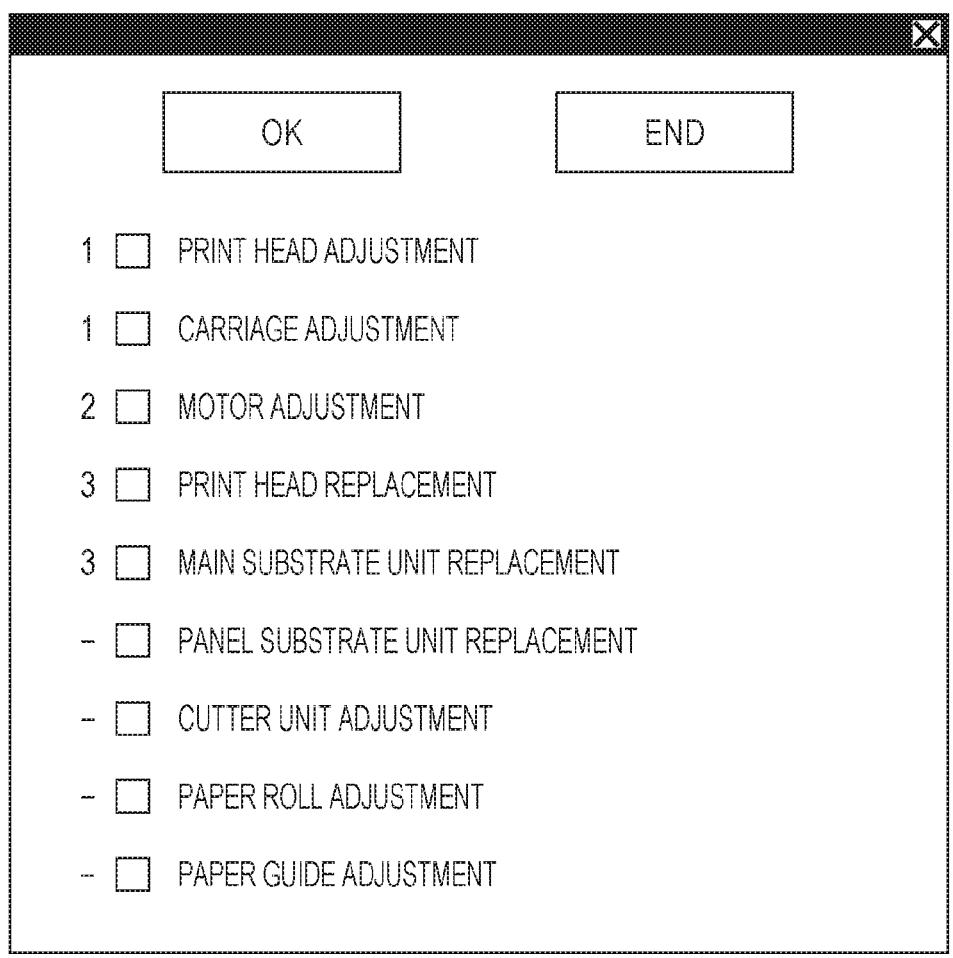
FIG. 5 is a diagram showing a display example of maintenance options.

FIG. 5 is a diagram showing an example of a screen for accepting maintenance selection. In FIG. 5, the OK button for instructing determination of the selected maintenance operation and the end button for instructing the end of maintenance are displayed. Furthermore, the maintenance as an option is displayed below the buttons.

That is, the character strings such as print head adjustment and print head replacement shown in FIG. 5 indicate individual maintenance. For example, in the case of the print head adjustment, a series of operations necessary for maintenance of the print head adjustment is shown. There is a checkbox on the left side of each maintenance, and the repair service provider can select the maintenance by checking the checkbox by operating the mouse 3a or the like. The priority order of maintenance is shown on the left side of the checkbox. That is, in the example shown in FIG. 5, the print head adjustment and the carriage adjustment have the same priority order.

Next, the processor 10c determines whether selection is accepted (step S225). That is, when the OK button is operated when the checkbox is checked, the processor 10c determines that the maintenance that is checked is selected. When it is not determined in step S225 that the selection is accepted, the processor 10c determines whether the maintenance is completed (step S240). That is, the processor 10c determines that the maintenance is completed when the end button is operated.

When it is determined in step S240 that the maintenance is completed, the processor 10c ends the maintenance process. The end of the maintenance means that the maintenance process is suspended without fixing the error. In this case, the error is not fixed. When the error is not fixed like this, the repair service provider generally returns to the service station temporarily, and performs a revisit after collecting cases and obtaining replacement parts.

On the other hand, when it is not determined in step S240 that the maintenance is completed, the processor 10c repeats the processes after step S225. When it is determined in step S225 that the selection is accepted, the processor 10c displays the accepted maintenance guide (step S230). That is, in the present embodiment, the maintenance is a series of operations for fixing the error, and a guide corresponding to each maintenance is formulated in advance. The guide may be defined in various ways. In this embodiment, the guide includes images in which a series of tasks is divided into a plurality of operations in time series, the respective operations after the division are indicated visually and clearly, and character strings indicating the contents of each operation. The processor 10c performs the guide by displaying respective images and character strings in time series.

In particular, the processor 10c controls the display 4 via the display interface 40, and displays an image and a character string indicating the first operation on the display 4. At this time, a button indicating a transition to the next operation is also displayed, and when the repair service provider operates the button, the screen transitions to a screen and a character string of the next operation. The repair service provider performs the necessary operation on the printer 2 according to such a guide, and performs a series of operations from the beginning to the end.

Further, in the course of each operation, the information processing apparatus 1 outputs, to the printer 2, a command for making an adjustment according to each operation. The printer 2 adjusts the respective units based on the command and returns the adjustment result (step S310). The information processing apparatus 1 acquires the adjustment result based on the returned contents. The adjustment is an adjustment determined in advance in order to fix a typical error occurring in each unit of the printer 2. For example, examples of the adjustment of the print head may include cleaning, wiping, flushing, and the like of nozzles that eject ink. The action for the adjustment is decided. The printer 2 can detect whether it is in a state where it can be normally operated after the adjustment, and returns whether the printer 2 is normal or abnormal as an adjustment result.

When the adjustment result is normal, the information processing apparatus 1, performs a series of operations according to the button operation of the repair service provider. When the adjustment result is abnormal, it suspends the series of operations. Of course, when the printer 2 is abnormal, the predetermined number of adjustments may be repeated, and when the result is normal after that, the process may proceed to the next operation.

When the series of operations is suspended or when the series of operations is performed to the end, the processor 10c determines whether the error is fixed (step S235). That is, when the series of operations is suspended, the processor 10c determines that the error is not fixed. When the series of operations is performed to the end and the result of each adjustment is not abnormal, it is determined that the error is fixed. The determination of the error fix may be performed by various methods, may be determined by the printer 2, or may be determined by a repair service provider. For example, when the diagnosis process is performed in the printer 2 and it is determined that the printer 2 is normal as a result of the diagnosis process, it may be considered that the error is fixed. Further, it may be considered that the error is fixed by the repair service provider visually checking or checking the specified items.

When it is not determined in step S235 that the error is fixed, the processor 10c performs the processes after step S220. In this case, the performed maintenance may not be displayed, or a display indicating that the maintenance has been performed may be performed. On the other hand, when it is determined in step S235 that the error is fixed, it is determined whether the operation that has been performed so far was an operation at the time of a revisit (step S245). Whether the operation is an operation at the time of a revisit may be performed by various methods. For example, the information processing apparatus 1 stores the identification number of the printer 2 on which the maintenance was performed, but for which the error was no fixed, and the date and time of the previous visit, and it is possible to use a configuration in which it is determined that the revisit was performed when the printer 2 to be maintained corresponds to the printer 2 one which the maintenance was performed, but for which the error was not fixed. Of course, the configuration in which whether the repair service provider performed the revisit is input to the information processing apparatus 1 may be used.

When it is not determined in step S245 that the operation that has been performed so far was an operation at the time of a revisit, the processor 10c adds to the teacher data 20d the status information and the installation environment information recorded in the RAM in step S207 and the maintenance performed last in association with each other (step S250). In other words, the maintenance performed when the repair service provider fixed the error of the printer 2 without performing a revisit is a maintenance through which the error is highly likely to be fixed without the need to perform a revisit. Therefore, in this embodiment, the maintenance through which the error is highly likely to be fixed without the repair service provider performing a revisit is added to the teacher data 20d as the learning source. When re-learning is performed based on the teacher data 20d updated with the addition in this embodiment, a machine-learned model 20c that outputs more efficient maintenance can be generated.

4. Other embodiments

The above embodiment is an example for carrying out the present disclosure, and various other embodiments can be implemented. In addition, the method of determining the priority order of maintenance based on the state of the device to be maintained or the installation environment as in the above embodiment can also be implemented as a program disclosure and a method disclosure.

Furthermore, the number of devices constituting the information processing apparatus may be any number. For example, the device constituting the machine learning apparatus may be realized by a device in which the information processing apparatus 1 and the printer 2 are integrated. Further, the information processing apparatus 1 may be configured by a tablet terminal in which the information processing apparatus 1 and the display 4 are integrated.

Furthermore, a configuration in which the function of the information processing apparatus 1 is implemented by a plurality of devices may be employed. For example, a server and a client are configured to be coupled, the machine learning process is performed on one of the server and the client, and the maintenance process may be performed on the other.

When a machine-learned model is present in a device that performs the machine learning process, and it is not present in a device that performs the maintenance process, the device that performs the maintenance process may be configured to inquire of the device that performs the machine learning process about the maintenance priority order. In this case, inference based on the machine-learned model 20c is also performed by the device that performs the machine learning process. Of course, a configuration in which the machine learning apparatus is dispersed in a plurality of devices, a configuration in which the information processing apparatus is dispersed in a plurality of devices, or another configuration may be used. Furthermore, the above-described embodiment is an example, and an embodiment in which part of the configuration is omitted or another configuration is added may be employed. Furthermore, the machine-learned model may be generated for a specific device to be maintained, or may be generated as a model used by a plurality of users based on the status information and the installation environment information collected from a plurality of devices to be maintained, and the maintenance to be performed.

The storage may store a machine-learned model created through machine learning using teacher data in which at least one of the status information indicating the status of the device to be maintained and the installation environment information indicating the environment where the device to be maintained is installed is associated with the maintenance to be performed on the device to be maintained. That is, the storage may store a machine-learned model in which the status and the installation environment, which are elements that can change the maintenance to be performed on the device to be maintained, are input, and that outputs the maintenance to be performed.

The device to be maintained is not limited to a printer, and may be various devices. Therefore, the device to be maintained may be an information device such as a scanner, a multifunction machine, or a projector, a computer or a computer peripheral, or a robot or a paper recycling device. Various devices may be used as the device to be maintained.

The status information indicates the status of the device to be maintained that may vary depending on the operation status of the device to be maintained, and may be any element that can determine the contents of maintenance. For this reason, it is not limited to the status information in the above embodiment, part of the status information in the above embodiment may be omitted, or other information may be added. For example, the elapsed time from the start of use, the continuous operation time, the operation frequency, and the like may be included in the status information. Of course, the status information may be different depending on the type of the device to be maintained or the like.

Further, the format of the status information is not limited to the configuration of the above-described embodiment. For example, the density of the ink used up to the current time may be an average of the density (ink usage amount) of the printed image as in the above embodiment, or may be the cumulative amount of ink used. Various modes can be used. In addition, the period during which the status information is collected is not limited. The current status may be collected as the status information, the past status may be collected as the status information, or both of these may be used.

The installation environment information is not information on the device to be maintained itself, but indicates the environment where the device to be maintained is located. Any element that can determine the contents of maintenance may be used. For this reason, it is not limited to the installation environment information in the above embodiment, part of the installation environment information in the above embodiment may be omitted, or other information may be added. For example, the installation environment information may include the amount of light and the air volume at the installation position, whether the installation position is located outdoors or indoors, the amount of surrounding chemical substances, and the like. Of course, the installation environment information may be different depending on the type of the device to be maintained.

Also, the format of the installation environment information is not limited to the configuration of the above-described embodiment. For example, each of a temperature, a humidity, and a atmospheric pressure may be a value at the current time as in the above embodiment, may be an average value from the start of use to the current time, or may be a value indicating a change in the past. Various modes can be used. Further, the period during which the installation environment information is to be collected is not limited. The past installation environment may be collected, or the current and the past installation environment may be collected.

Of course, an element that can be an input to the machine-learned model in the teacher data may include information other than status information and the installation environment information. For example, information indicating the user of the device to be maintained (individual use, corporate use, and the like), the contract type (contract with an entity that performs mass printing, monochrome print specialized contract, color print allowable contract, fixed amount contract, pay-per-use contract, and the like), or the like may be an input to the machine-learned model.

Maintenance to be performed on a device to be maintained may be the maintenance when the maintenance is required for the device to be maintained that is installed in a certain installation environment, and that is in a certain status. Therefore, the type of the maintenance to be performed may be one or plural.

In addition, the maintenance to be performed may be essential maintenance for operating the device to be maintained, or may be recommended maintenance although it is not essential. The former is, for example, as in the above embodiment, the maintenance for fixing an error when the operation of the printer is stopped due to the error (including failure). Examples of the latter include maintenance for extending the continuous operation time or the period until an error occurs although the printer is not stopped, maintenance for improving printing quality, and the like.

The machine-learned model may be any model that outputs the maintenance to be performed so as to reproduce the relationship between input information (at least one of the status information and the installation environment information) and output information (maintenance to be performed on the device to be maintained) indicated by the teacher data. Therefore, any model structure is used as long as the maintenance to be performed can be output based on at least one of the status information and the installation environment information. That is, when it is possible to learn a model that reproduces such an input/output relationship, any machine learning mode and any model mode are used.

For example, when the machine learning using the neural network is performed, the machine learning may be performed by appropriately selecting various elements such as the number of layers constituting the model, the number of nodes, the type of the activation function, the type of the loss function, the type of the gradient descent method, the type of the optimization algorithm of the gradient descent method, whether to perform mini-batch learning or the number of batches, the learning rate, the initial value, the type of an over learning suppression method or whether to perform the over learning suppression method, the presence or absence of a convolution layer, the size of a filter in a convolution operation, the type of the filter, the type of padding and stride, the kind of a pooling layer, the presence or absence of the pooling layer, the presence or absence of a total binding layer, and the presence or absence of a recursive structure. Of course, another machine learning, for example, learning such as support vector machine, clustering, or reinforcement learning may be performed.

Furthermore, machine learning in which the model structure (for example, the number of layers, the number of nodes per layer, and the like) is automatically optimized may be performed. Furthermore, the learning may be performed by being divided into a plurality of stages. For example, a configuration in which machine learning that outputs a part requiring maintenance from at least one of the status information and the installation environment information and machine learning that outputs maintenance to be performed from the part requiring maintenance are performed may be used. Furthermore, in the configuration where the machine learning is performed in the server, the status information and the installation environment information of a plurality of devices to be maintained are collected and used as teacher data, and the machine learning is performed based on this teacher data.

The processor may acquire the maintenance to be performed on the device to be maintained using at least one of the status information of the device to be maintained and the installation environment information, and the machine-learned model, and may display the maintenance priority order. That is, the processor may output the maintenance corresponding to at least one of the status information and the installation environment information based on the machine-learned model, and may determine and display the priority order based on the output result.

Maintenance to which a fix of the error of a device to be maintained is attributed is the maintenance when the device to be maintained which is in an inoperable state turns to operable state by performing the maintenance. Such maintenance may be one or more types of maintenance.

The maintenance of the device to be maintained may be performed as self-maintenance by the user of the printer 2 instead of the repair service provider. In this case, the user starts a program such as application software for performing maintenance of the printer 2, and the maintenance is performed based on navigation operations.

Furthermore, the present disclosure can also be applied as a program or method executed by a computer. Further, the above-described program and method may be implemented using a single device or may be implemented using components included in a plurality of devices, and include various aspects. Further, changes may be made as appropriate, as in the case where part of the embodiment is software and part of the embodiment is hardware. Furthermore, the disclosure is established as a recording medium of a program. Of course, the recording medium of the program may be a magnetic recording medium, a semiconductor memory, or any recording medium to be developed in the future.

What is claimed is:

1. An information processing apparatus comprising:
   a storage that stores a machine-learned model, which has been trained using teacher data in which at least one of status information indicating a status of a device to be maintained and installation environment information indicating an environment where the device to be maintained is installed is associated with a maintenance operation to be performed on the device to be maintained; and
   a processor that:
      provides to the machine-learning model at least one of current status information of the device to be maintained and current installation environment information,
      acquires, from the machine-learned model, maintenance operations to be performed on the device to be maintained and a maintenance priority order of each of the maintenance operations, and
      displays the maintenance operations in order according to the maintenance priority order.

2. The information processing apparatus according to claim 1, wherein
   the maintenance operation that is indicated by the teacher data, and which is to be performed on the device to be maintained, is performed when an error of the device to be maintained is fixed without a repair service provider performing a revisit.

3. The information processing apparatus according to claim 1, wherein
   the maintenance operation that is indicated by the teacher data, and which is to be performed on the device to be maintained, is an operation to which a fix of an error of the device to be maintained is attributed.

4. A machine learning apparatus comprising:
   one or more processors; and
   one or more hardware storage devices that store instructions that are executable by the one or more processors to cause the one or more processors to:
      provide to a machine-learning model at least one of current status information of the device to be maintained and current installation environment information, wherein the machine-learning model has been trained using teacher data in which at least one of status information indicating a status of a device to be maintained and installation environment information indicating an environment in which the device to be maintained is installed is associated with a maintenance operation to be performed on the device to be maintained;
      acquire, from the machine-learning model, maintenance operations to be performed on the device to be maintained and a maintenance priority order of each of the maintenance operations; and
      display the maintenance operations in order according to the maintenance priority order.

5. An information processing method comprising:
providing to machine-learning model at least one of current status information of a device to be maintained and current installation environment information, wherein the machine-learned model has been trained using teacher data in which at least one of status information indicating a status of the device to be maintained and installation environment information indicating an environment where the device to be maintained is installed is associated with a maintenance operation to be performed on the device to be maintained;
acquiring, from the machine-learning model, maintenance operations to be performed on the device to be maintained and a maintenance priority order of each of the maintenance operations; and
displaying the maintenance operations in order according to the maintenance priority order.

* * * * *